United States Patent
Kinback

(10) Patent No.: US 7,146,717 B2
(45) Date of Patent: Dec. 12, 2006

(54) COMPONENT REJECTION STATION

(75) Inventor: Jack A. Kinback, Binghamton, NY (US)

(73) Assignee: Universal Instruments Corporation, Binghamton, NY (US)

( * ) Notice: Subject to any disclaimer, the term of this patent is extended or adjusted under 35 U.S.C. 154(b) by 273 days.

(21) Appl. No.: 10/828,138

(22) Filed: Apr. 20, 2004

(65) Prior Publication Data

US 2005/0241144 A1    Nov. 3, 2005

(51) Int. Cl.
  *B33P 19/00* (2006.01)
(52) U.S. Cl. ............................ 29/739; 29/740; 29/743; 269/49
(58) Field of Classification Search ................. 29/739, 29/740, 743; 269/49
  See application file for complete search history.

(56) References Cited

U.S. PATENT DOCUMENTS

| | | | |
|---|---|---|---|
| 3,384,236 A * | 5/1968 | Best et al. .................. 209/541 |
| 4,898,507 A * | 2/1990 | Hawkswell ............ 414/225.01 |
| 5,018,193 A | 5/1991 | DeArkland |
| 5,076,505 A | 12/1991 | Petrocy |
| 5,093,982 A * | 3/1992 | Gussman ..................... 29/705 |
| 5,400,396 A | 3/1995 | Hsu |
| 5,783,142 A | 7/1998 | Lindsay |
| 5,852,869 A * | 12/1998 | Gieskes et al. ............... 29/834 |
| 5,899,395 A | 5/1999 | Deklerow |
| 6,249,574 B1 | 6/2001 | Taylor et al. |
| 6,490,502 B1 * | 12/2002 | Fellows et al. ............. 700/231 |

* cited by examiner

*Primary Examiner*—Carl J. Arbes
(74) *Attorney, Agent, or Firm*—Schmeiser, Olsen & Watts

(57) ABSTRACT

The present invention features a method and apparatus wherein a component in a component placement machine is rejected during the placement cycle and subsequently retained in a component rejection station. A component is imaged and the image processed using an automated vision system. The image processing determines whether the component is placeable based upon a comparison of the component image to preprogrammed mechanical parameters for the component. A non-placeable component is rejected into a reject station with means to retain the component. Because a component can not escape the reject station, there is no degradation of the placement machine performance.

3 Claims, 6 Drawing Sheets

COMPONENT REJECTION STATION

BACKGROUND OF THE INVENTION

1. Technical Field

This invention relates to component placement machines and, more particularly, to an apparatus used for rejection of a component during the placement cycle.

2. Related Art

The use of sophisticated placement machines in manufacturing printed circuit or similar cards, boards, panels, etc. is well known. The term printed circuit board (PCB) as used herein refers to any such electronic packaging structure. Typically, reels of tape-mounted circuit components are supplied to the placement machine by multiple feeders. Each feeder holds a reel of components and each feeder assembly provides components at a pick station. A housing carrying one or more pick/place heads mounted on a frame, each pick/place head having a vacuum spindle equipped with a nozzle, may be moved in the X and Y axes in a plane above the PCB being populated. Each vacuum spindle may be moved in the Z-axis (e.g., in and out from an extended to a retracted position). Each nozzle is sized and otherwise configured for use with each different size and style of component to be placed by the machine.

In operation, the housing carrying the frame is moved to the pick station and the nozzle of one of the pick/place heads is positioned over the tape-mounted component. The nozzle is lowered, via its associated vacuum spindle, to a point where, upon application of vacuum, the component is removed from its backing tape and held tightly against the nozzle orifice. The component is then brought to a vision system where one or more images of the component are taken and then processed.

Analysis of the image(s) determines whether the component is placeable. Typically, a placeability decision is based on a comparison of the image to predetermined mechanical parameters for each component. If the component is placeable, the pick/place head is moved to a point over the printed circuit board being assembled and the component deposited on the printed circuit board at a predetermined location. If a component is non-placeable, it is rejected and deposited to a reject station. The mechanical parameters used for comparison may include, but are not limited to, lead length, lead width, lead spacing, component size, the number of leads, etc.

It is also known in the art to use a gripping mechanism that may be extended and retracted in place of, or in addition to, the vacuum spindle and nozzle.

This reject station may be a dump bucket, a reject feeder, or a matrix tray. Dump buckets typically are mounted somewhere accessible to the pick/place head within the placement machine or mounted on the housing contiguous with the pick/place head. The pick/place head carrying a rejected component will place the component on to the reject feeder, or into a pocket of the matrix using the vacuum spindle. However, when the pick/place head must reject the component into a dump bucket, it drops the component from the vacuum spindle often using a combination of vacuum removal and "airkiss". Many times components rejected in this manner miss the dump bucket or bounce out of the dump bucket upon depositing therein and ultimately end up else where in the machine. This results in poor product, jammed feeders, and poor production rates.

A need exists for an improved rejection station that overcomes the aforementioned, and other, deficiencies in the art.

SUMMARY OF THE INVENTION

The present invention provides an improvement in the way that non-placeable components are handled in a component placement machine when rejected into a dump bucket style reject station. The inventive apparatus allows the dump bucket to retain the rejected components by attaching a flap to the dump bucket. The flap dampens the force of the component as it enters the dump bucket and then prevents the component from escaping the dump bucket once the component passes by the flap. Therefore, with the flap attached to the dump bucket, components no longer escape the dump bucket resulting in inter alia better product and production rates of the placement machine.

A first general aspect of the present invention is a method for rejecting a component from a pick/place head in a component placement machine, the steps comprising:

providing a component placement machine comprising a housing adapted for movement along an X and a Y axis above a printed circuit board and having a frame attached thereto, said frame having a one or more pick/place heads disposed thereupon;

providing a vision system comprising a camera accessible to said one or more pick/place heads;

picking a component from a supply of components using at least one of said one or more of pick/place heads;

capturing an image of said picked component, and processing said captured image to determine whether said picked component is placeable or non-placeable;

providing a reject station adapted to receive a component;

adapting said reject station with means to reduce the force upon which said component impacts said reject station; and adapting said reject station with means to prevent said component from escaping said reject station.

A second general aspect of the present invention is a apparatus for retaining a rejected component from a pick/place head in a component placement machine, the apparatus comprising:

a reject station mounted in a location accessible by said pick/place head; and at least one flap mounted contiguous with said reject station, wherein said at least one flap dampens the force in which said component impacts said reject station, further wherein said at least one flap prevents said component from escaping said reject station.

A third general aspect of the present invention is an apparatus for retaining rejected components in a component placement machine comprising:

a reservoir for retaining said rejected components; and means adjacent to said reservoir, wherein said means is configured to absorb adequate energy from said rejected component upon its passage through said means, further wherein said means prevents said rejected component from passing back through said means thereby retaining said rejected component in said reservoir.

BRIEF DESCRIPTION OF THE DRAWINGS

A complete understanding of the present invention may be obtained by reference to the accompanying drawings, when considered in conjunction with the subsequent detailed description, in which.

DETAILED DESCRIPTION OF THE INVENTION

Figure 1A:
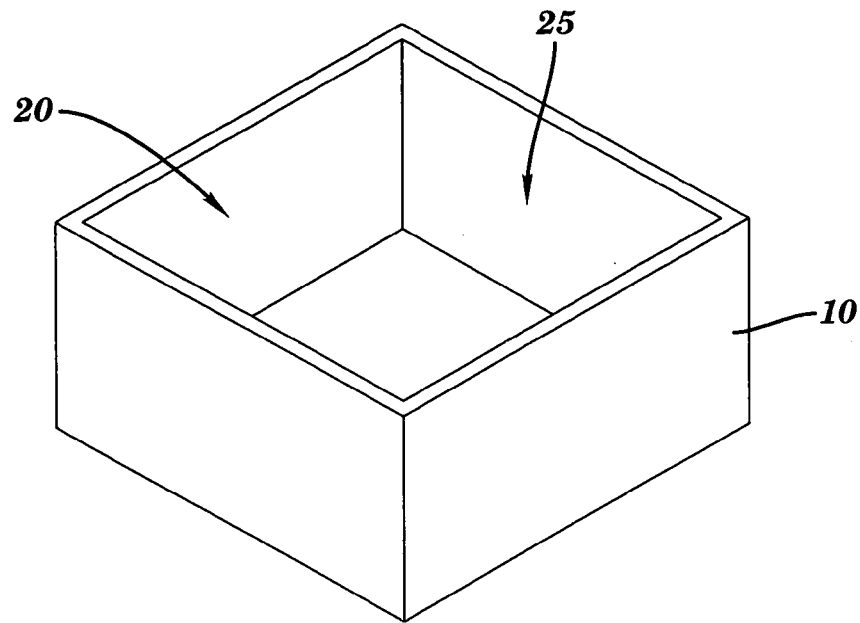
FIG. 1A is a top, perspective view of a related art dump bucket.

Although certain embodiment of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of an embodiment. The features and advantages of the present invention are illustrated in detail in the accompanying drawings, wherein like reference numerals refer to like elements throughout the drawings.

The present invention pertains to rejection of a component in a component placement machine having a housing with a frame upon which one or more pick/place heads are mounted for assembling printed circuit boards. The component placement machine includes a reject station, which may be a dump bucket located within the placement machine accessible to the pick/place head or it may be mounted on the housing contiguous with the pick/place heads. The inventive apparatus includes a flap contiguous with the reject station which acts to dampen the force of the component as it enters the reject station and then prevents the component from escaping the reject station once the component passes by the flap. The type of components that typically are rejected and stored by the invention are electronic circuit components with a weight in the range from approximately 50 micrograms to 15 grams.

Figure 1B:
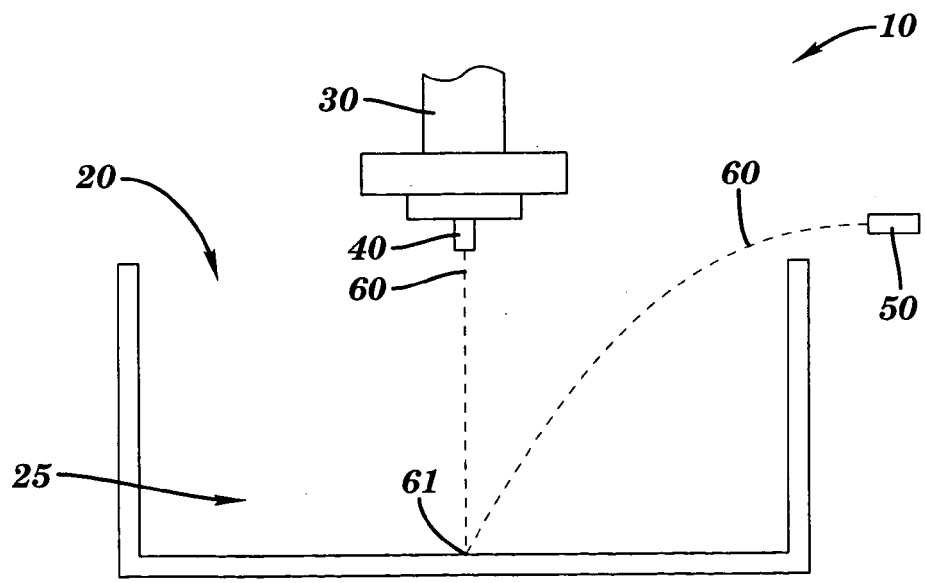
FIG. 1B is a side, sectional view FIG. 1A, including a spindle.

Turning now to FIG. 1A, which depicts a dump bucket 10 that would be mounted in a machine accessible to the pick/place head from the related art, said dump bucket 10 includes an opening 20 that leads to a reservoir 25 for retaining rejected components(s) 50 (See e.g., FIG. 1B). The side sectional view in FIG. 1B shows a vacuum spindle 30 with nozzle 40 having just deposited a rejected component 50 into the reservoir 25 of the dump bucket 10. A trajectory path 60 of the rejected component 50 shows that upon the impact point 61 of the component 50 on a portion of the reservoir 25, that in many cases the component 50 then bounces out of the opening 20 of the reservoir 25 and dump bucket 10.

Figure 2A:
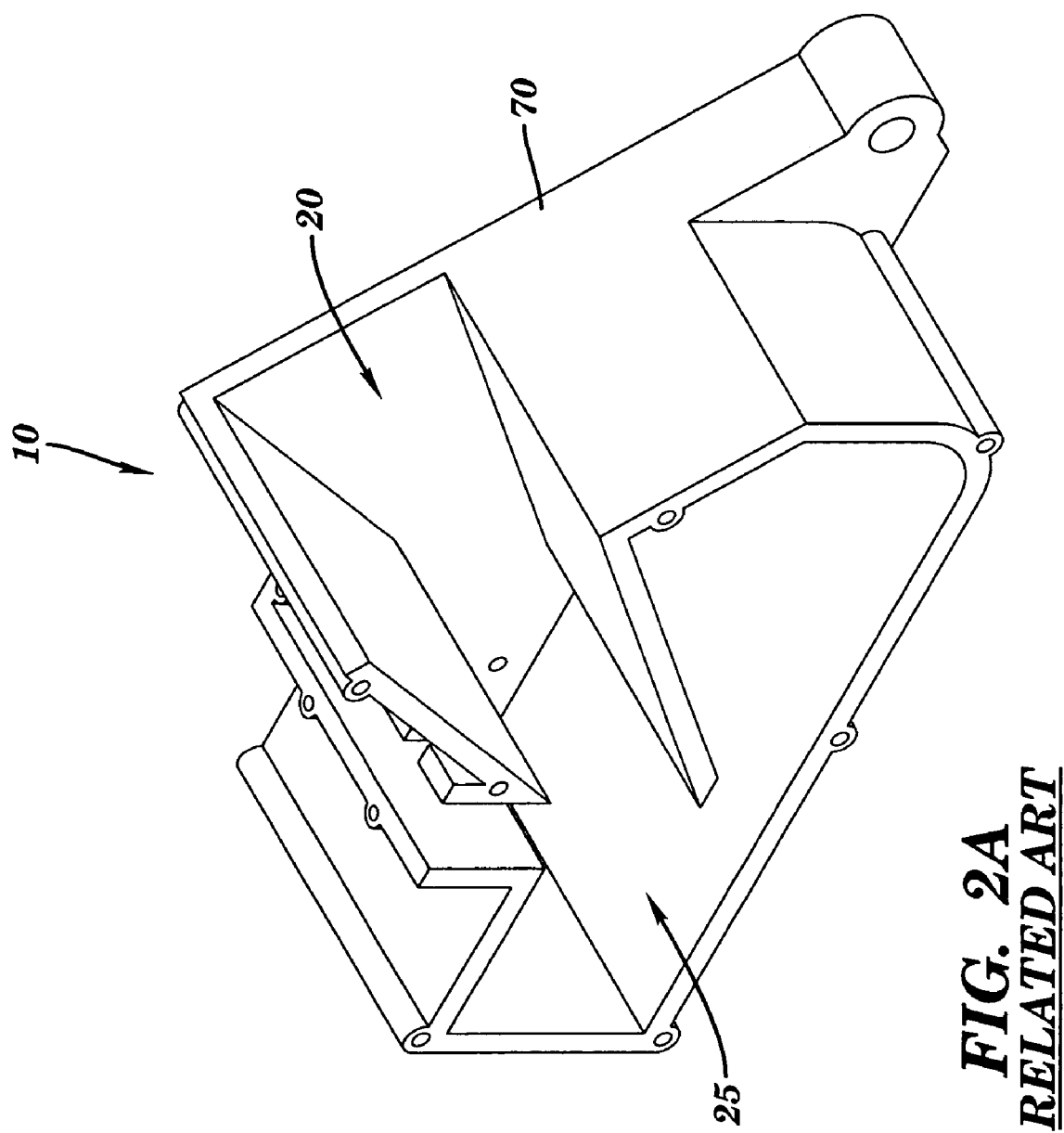
FIG. 2A is a top, perspective sectional view of a related art reject station that may be mounted contiguous with the pick/place head.
Figure 2B:
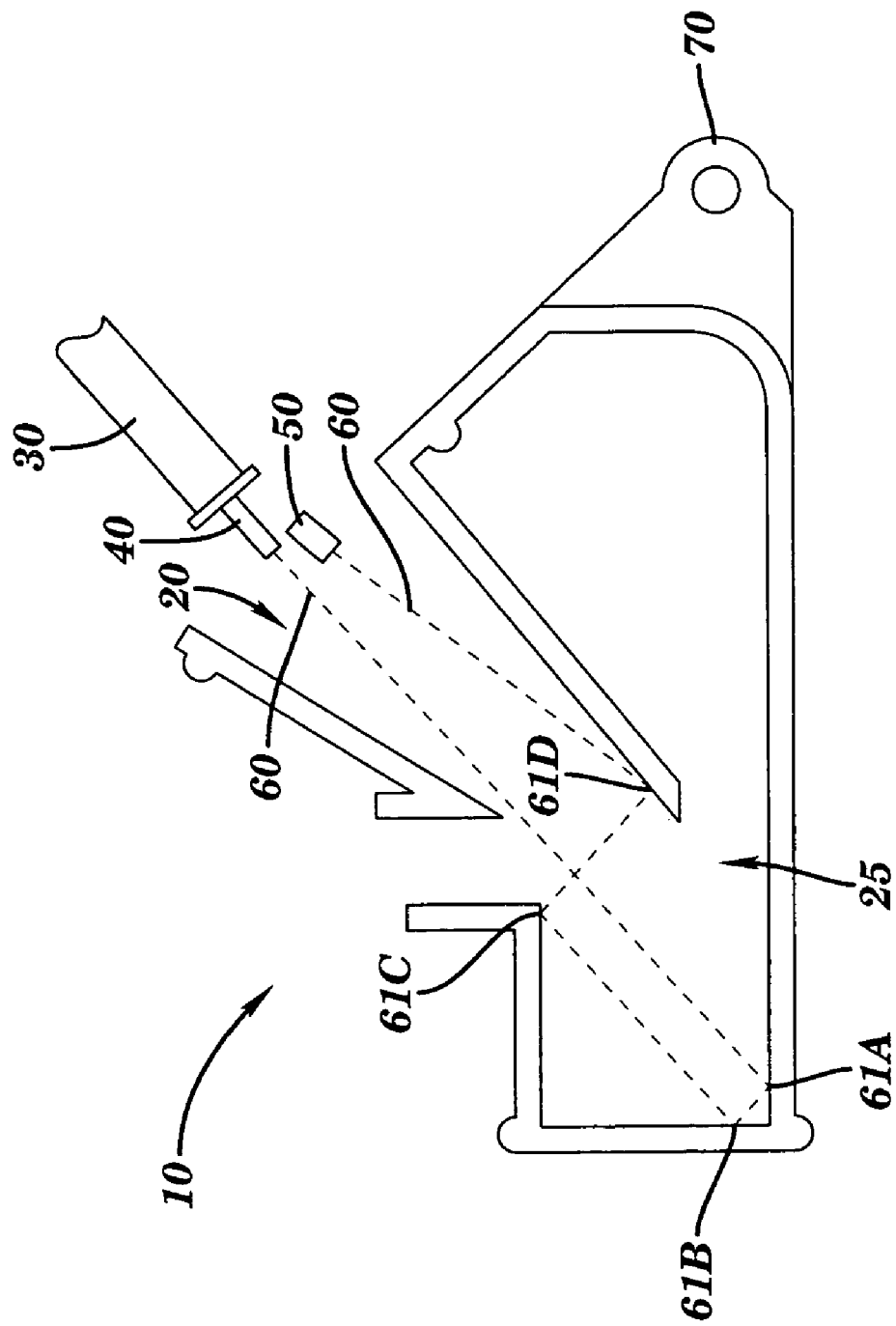
FIG. 2B is a side, sectional view FIG. 2A, including a spindle.

Similarly, FIGS. 2A and 2B depict a second embodiment of a dump bucket 10 that would be mounted contiguous to the pick/place head in the related art, wherein the same shortcoming exists. That is upon the depositing of the rejected component 50, on many occasions, the component 50 ultimately ends up outside the dump bucket 10. One trajectory path 60 is shown as an example of one typical path that the component may take. That is the component 50 makes a series of impacts 61A, 61B, 61C, 61D on various parts of the reservoir 25, or other parts of the dump bucket 10, ultimately ending up beyond the opening 20 of the dump bucket 10.

It should be apparent to those of ordinary skill in the art, that while some rejected components 50 are retained within the reservoir 25 of the dump bucket 10, one or more components 50 clearly will be ejected out of the dump bucket 10 as shown in FIGS. 1B and 2B. The present invention corrects this deficiency by ensuring that no components 50 escape the dump bucket 10.

Figure 3A:
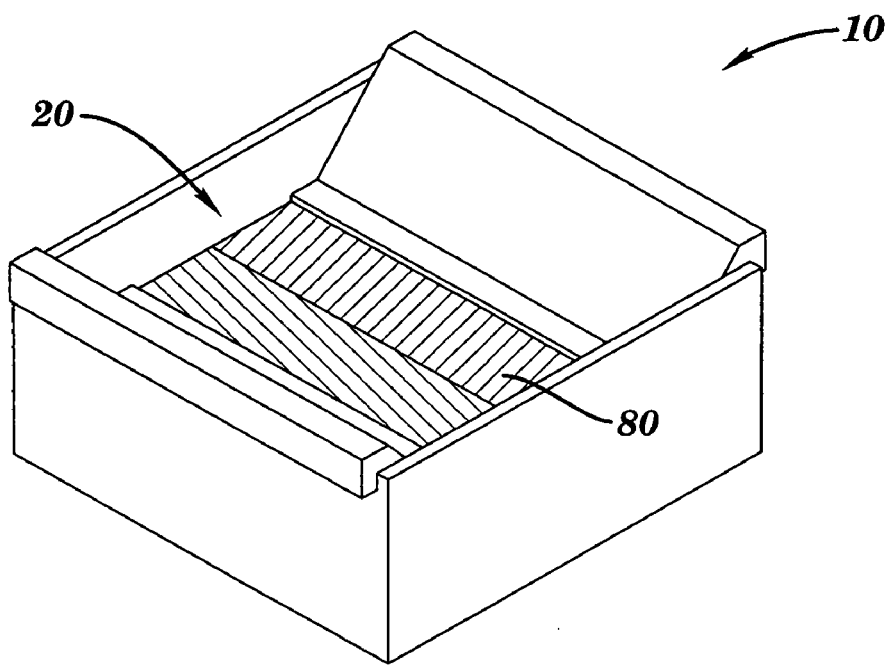
FIG. 3A is a top, perspective view of a first embodiment of a component rejection station, in accordance with the present invention.
Figure 3B:
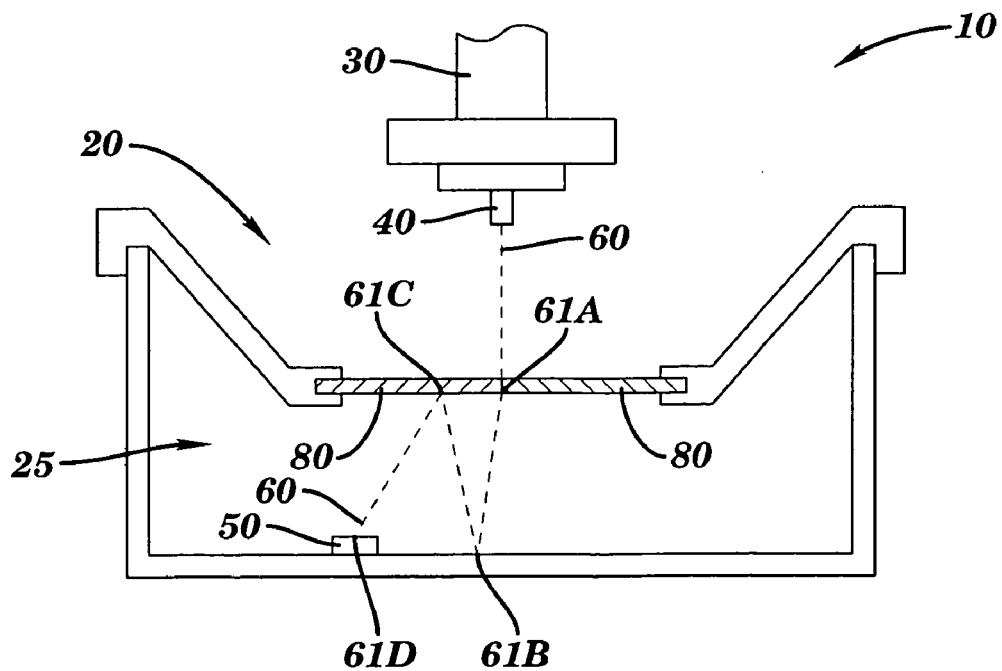
FIG. 3B is a side, sectional view FIG. 3A, including a spindle.

Referring first to FIG. 3A there is shown a top, perspective view of a first embodiment of a dump bucket 10, or component rejection station, in accordance with the present invention, with opening 20, adapted with a flap 80. FIG. 3B is a side, sectional view of FIG. 3A and includes the path 60 of the component 50 as it is rejected from the vacuum spindle 30 of nozzle 40. The vacuum spindle 30 releases the component 50 by removing vacuum from the nozzle 40. Vacuum spindle 30 may also release the component 50 by a combination of removing vacuum from the nozzle 40 and applying an airkiss, a slight flow of air, to component 50 via nozzle 40. Component 50 becomes disengaged from nozzle 40 and drops on to flap 80. The first impact of the component 50 is denoted 61A. Flap 80 is then deflected allowing component 50 to pass through the opening 20 into the bottom of dump bucket 10. A second impact 61B of the component is shown at the bottom of the reservoir 25. When component 50 impacts flap 80, flap 80 absorbs force from component 50 slowing the descent of component 50. Component 50 may then continue to bounce within dump bucket 10. Subsequent impact of the component 50 upon the underside of the flap 80 is shown 61C. However since the force of component 50 was reduced by flap 80 upon passage through opening 20, it does not have sufficient energy to pass back through opening 20 via flap 80. The component 50 ultimately comes to rest upon the bottom of the reservoir 25, as shown at 61D.

Figure 4A:
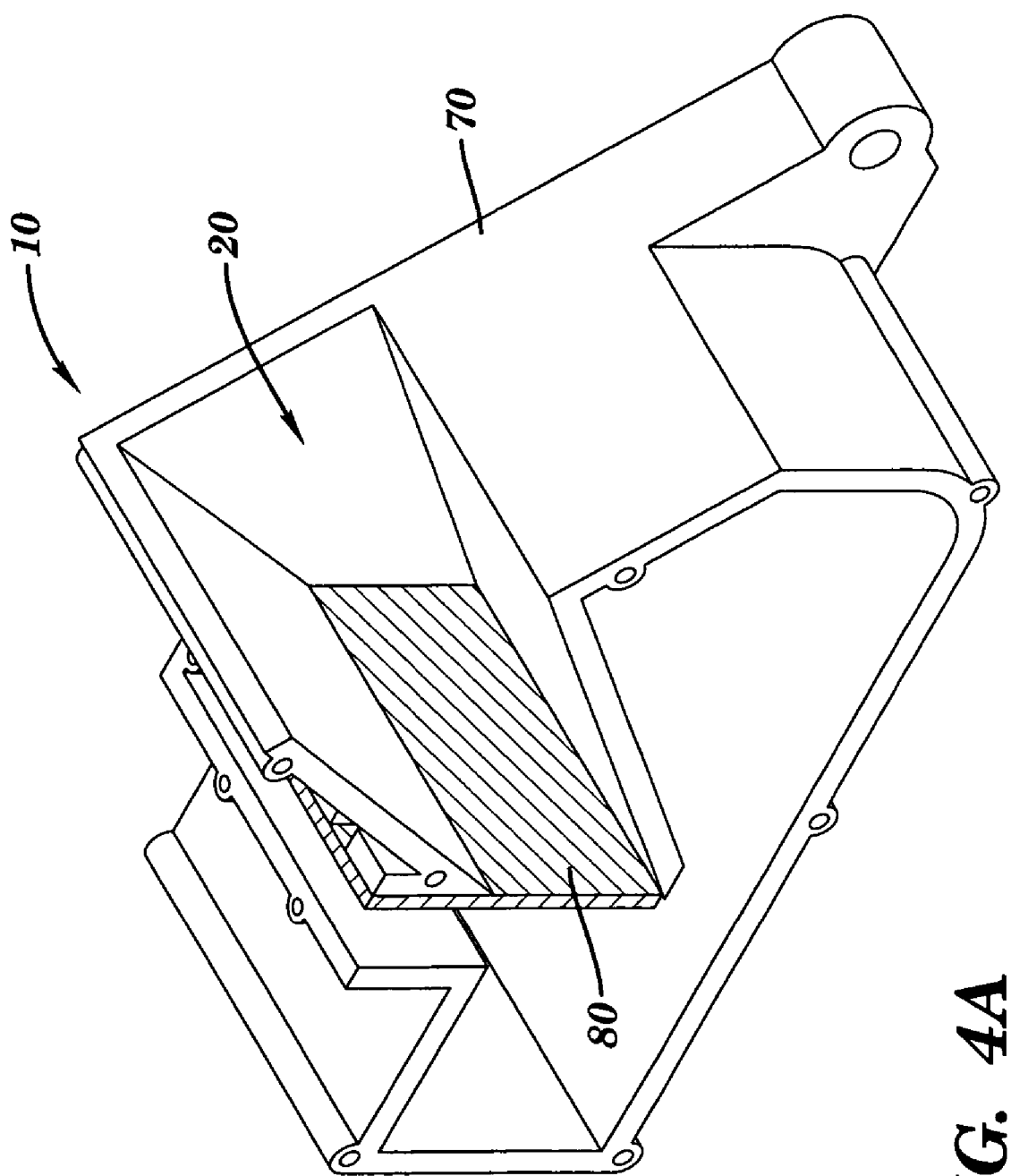
FIG. 4A is a top, perspective view of a second embodiment of a component rejection station, in accordance with the present invention.
Figure 4B:
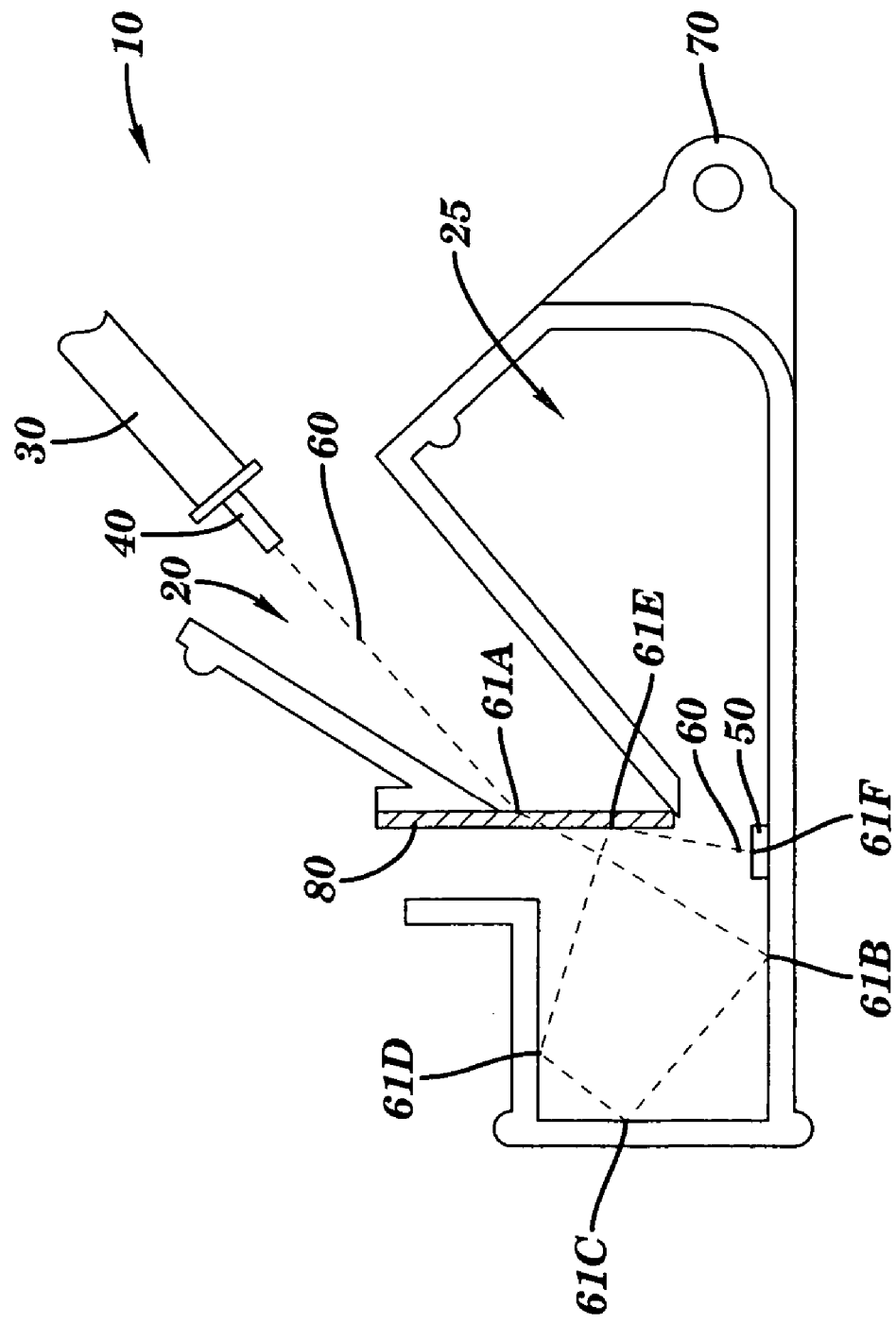
FIG. 4B is a side, sectional view FIG. 4A, including a spindle.

Referring next to FIG. 4A which depicts a second embodiment of a component rejection station which is mounted contiguous with pick and place spindles, in accordance with the present invention. In this case, the component rejection station includes a dump bucket 10, with opening 20, adapted with flap 80. FIG. 4B, similarly, is a side sectional view of FIG. 4A and includes the path 60 of the component 50 as it is rejected from the vacuum spindle 30 of nozzle 40. The various impacts of the rejected component 50 are denoted 61 (e.g., 61A, 61B, 61C, 61D, 61E, 61F). The vacuum spindle 30 releases the component 50 by removing vacuum from the nozzle 40. Vacuum spindle 30 may also release the component 50 by a combination of removing vacuum from the nozzle 40 and applying an airkiss, a slight flow of air, to component 50 via nozzle 40. Component 50 becomes disengaged from nozzle 40 and drops on to flap 80. The impact upon the flap 80 is denoted 61A. Flap 80 is then deflected allowing component 50 to pass through the opening 20 into the bottom of the dump bucket 10. When component 50 impacts 61A flap 80, flap 80 absorbs force from component 50 slowing the descent of component 50. Component 50 may then continue to bounce within the reservoir 25 of the dump bucket 10. However since the force of component 50 was reduced by flap 80 upon passage through opening 20, it does not have sufficient energy to pass back through opening 20 via flap 80. Numerous subsequent impacts of the component 50 are shown as 61B, 61C, 61D 61E, while the final resting location of the component 50 upon the bottom of the reservoir 25 is denoted as 61F.

It should be apparent that although two embodiments of the present invention are depicted there are other embodiments available that provide the requisite improvements of the present invention. For example, the flap 80, while depicted as either a single flap 80 (e.g., FIGS. 4A, 4B) or two opposing flaps 80 (e.g., FIGS. 3A, 3B), may have other embodiments. The flap 80 may be, for example, more than two flaps 80. In the embodiments where there is a plurality of flaps 80, the various flaps 80 may also abut or overlap each other. Further, the flap(s) 80 may, depending on the configuration and shape of the opening 20 and other parts of the dump bucket 10, not abut, or overlap, each other, or even completely cover the opening 20.

Likewise, there are various materials in which the flap 80 may be constructed. The flap 80 should be of a resilient, energy-absorbing material so that various sized rejected components 50 may pass by the flap 80 upon initial contact, yet cannot pass through a second time, or any subsequent time, upon the rebounding of the component 50 around the reservoir 25 of the dump bucket 10. One embodiment the flap 80 may be made of Mylar®. Alternatively, the flap 80 may be made of multiple materials.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

What is claimed is:

1. An apparatus for retaining a rejected component from a pick/place head in a component placement machine, the apparatus comprising:
   a reject station mounted in a location accessible by said pick/place head; and
   at least one flap mounted contiguous with said reject station, wherein said at least one flap dampens the force in which said component impacts said reject station, further wherein said at least one flap prevents said component from escaping said reject station.

2. The apparatus of claim 1, wherein said reject station is mounted in said component placement machine.

3. The apparatus of claim 1, wherein said reject station is mounted contiguous with said pick/place head.

* * * * *